United States Patent
Eissa et al.

[11] Patent Number: 6,030,706
[45] Date of Patent: Feb. 29, 2000

[54] INTEGRATED CIRCUIT INSULATOR AND METHOD

[75] Inventors: Mona Eissa, Plano; Justin Gaynor, Dallas, both of Tex.

[73] Assignee: Texas Instruments Incorporated, Dallas, Tex.

[21] Appl. No.: 08/965,454

[22] Filed: Nov. 6, 1997

Related U.S. Application Data
[60] Provisional application No. 60/029,743, Nov. 8, 1996.

[51] Int. Cl.[7] .................................................. B32B 27/00

[52] U.S. Cl. .......................... 428/421; 428/461; 428/901; 174/258; 361/751; 528/10

[58] Field of Search .................................. 428/209, 901, 428/421, 461; 528/10; 361/751; 174/258

[56] References Cited

U.S. PATENT DOCUMENTS

| | | | |
|---|---|---|---|
| 5,210,341 | 5/1993 | Dolbier, Jr. et al. | 540/144 |
| 5,268,202 | 12/1993 | You et al. | 427/255.6 |
| 5,492,736 | 2/1996 | Laxman et al. | 428/688 |
| 5,607,773 | 3/1997 | Ahlburn et al. | 428/901 |
| 5,759,906 | 6/1998 | Lou | 438/626 |
| 5,783,484 | 7/1998 | Jun | 438/631 |
| 5,828,132 | 10/1998 | Eissa | 257/642 |

*Primary Examiner*—Deborah Jones
*Assistant Examiner*—Cathy F. Lam
*Attorney, Agent, or Firm*—Carlton H. Hoel; W. James Brady; Richard L. Donaldson

[57] ABSTRACT

A intermetal level dielectrics with copolymers of parylene and cyclic siloxances (432, 482) between metal lines plus oxides (450, 490), and vapor deposition method for the copolymerization. Fluorination of the copolymers lowers dielectric constant and increases working temperature.

4 Claims, 6 Drawing Sheets

INTEGRATED CIRCUIT INSULATOR AND METHOD

CROSS-REFERENCE TO RELATED APPLICATIONS

The following provisional U.S. patent application discloses related subject matter: serial No. 60/029,743, filed Nov. 8, 1996. These application(s) are assigned to the assignee of the present application.

BACKGROUND OF THE INVENTION

The invention relates to semiconductor devices, and, more particularly, to integrated circuit insulation and methods of fabrication.

Integrated circuits typically include field effect transistors with source/drains formed in a silicon substrate and insulated gates on the substrate together with multiple overlying metal (or polysilicon) interconnections formed in levels. An insulating layer lies between the gates/sources/drains and the interconnections formed from the first metal level (premetal dielectric) and also between successive metal levels (intermetal-level dielectric). Vertical vias in the insulating layers filled with metal (or polysilicon) provide connections between interconnections formed in adjacent metal levels and also between the gate/source/drain and the first metal level interconnections. Each insulating layer must cover the relatively bumpy topography of the interconnections of a metal level or the gates, and this includes crevices between closely spaced interconnects in the same metal level. Also, the dielectric constant of the insulating layer should be as low as practical to limit capacitive coupling between closely spaced interconnects in the same metal level and in adjacent overlying and underlying metal levels.

Various approaches to forming insulating layers over bumpy topography have been developed which all form a silicon dioxide (oxide) type insulator: reflowing deposited borophosphosilicate glass (BPSG), using spin-on glass (SOG) which typically are siloxanes, sputtering while depositing in plasma enhanced chemical vapor deposition (PECVD) with tetraethoxysilane (TEOS), etching back a stack of deposited glass plus spun-on planarizing photoresist, and chemical-mechanical polishing (CMP).

All these approaches have problems including the relatively high dielectric constant of silicon dioxide: roughly 3.9. This limits how closely the interconnections can be packed and still maintain a low capacitive coupling.

Laxman, Low $\epsilon$ Dielectrics: CVD Fluorinated Silicon Dioxides, 18 Semiconductor International 71 (May 1995), summarizes reports of fluorinated silicon dioxide for use as an intermetal level dielectric which has a dielectric constant lower than that of silicon dioxide. In particular, PECVD using silicon tetrafluoride ($SiF_4$), silane ($SiH_4$), and oxygen ($O_2$) source gasses can deposit $SiO_XF_Y$, with up to 10% fluorine and a dielectric constant in the range 3.0 to 3.7. But this dielectric constant still limits the packing density of interconnections.

Organic polymer insulators provide another approach to low dielectric constant insulators. Formation by chemical vapor deposition (CVD) ensures filling of crevices between closely spaced interconnections. Some integrated circuit fabrication methods already include polyimide as a protective overcoat. However, polyimide has problems including a dielectric constant of only about 3.2–3.4 and an affinity to absorb water which disrupts later processing when used as an intermetal level dielectric. On the positive side, it does have a temperature tolerance up to about 500° C.

Parylene is a generic term for a class of poly-para-xylylenes with structures such as the following:

PA-N

PA-F

These polymers are members of a family of thermoplastic polymers that have low dielectric constants (e.g., 2.35 to 3.15), low water affinity, and may be conformally deposited from a vapor without solvents and high temperature cures. Parylene with hydrogen on the aliphatic carbons may be used at temperatures up to about 400° C. under an $N_2$ atmosphere, whereas aliphatic perfluorination increases the useful temperature to about 530° C.

You et al., Vapor Deposition of Parylene Films from Precursors, in Chemical Perspectives of Microelectronic Materials III, Materials Research Society Symposium Proceedings Nov. 30, 1992, discloses a method for fabrication of fluorinated parylene by starting with a liquid dibromotetra-fluoro-p-xylene precursor and then converting the precursor at 350° C. to active monomers which adsorb and polymerize at –15° C. on a substrate. The reaction looks like:

You et al. synthesize the precursor from the dialdehyde (terephthalaldehyde):

The benzene ring could also be (partially) fluorinated with standard halogenation methods. Such fluorination would lower the dielectric constant and increase the useful temperature.

The parylene films may also be deposited with the use of dimers of the active monomers as an intermediate product. See, You et al. and Dolbier et al., U.S. Pat. No. 5,210,341, as in the reaction:

However, these organic polymers often have problems including poor adhesion to silicon oxides and metal, and insufficient thermal stability for the subsequent processing typically found in integrated circuit fabrication, such as an aluminum sinter at 450° C.

SUMMARY OF THE INVENTION

The present invention provides copolymers of parylene monomers and silicon-carbon containing monomers including siloxanes, a vapor deposition method for the copolymerization, and applications of the copolymers as insulators for integrated circuits.

Advantages of the invention include an interlevel dielectric with low dielectric constant, high thermal stability, acceptable thermal conductivity, good adhesion to silicon dioxide and metals, mechanical strength, conformal deposition which can fill narrow gaps, ease of etching, low film stress, low water absorption, and high electrical resistivity.

BRIEF DESCRIPTION OF THE DRAWINGS

The drawings are schematic for clarity.

DESCRIPTION OF THE PREFERRED EMBODIMENTS

First preferred embodiment

FIGS. 1a–d illustrate in cross sectional elevation view the steps of a first preferred embodiment method of insulator dielectric formation between metal lines during integrated circuit fabrication. In particular, start with the partially fabricated circuit of FIG. 1a which includes polysilicon gate 104 and field oxide 106 on silicon substrate 102 and lying under premetal level dielectric (PMD) 110 with metal lines 112–120 on PMD 110 and metal filled vias 122–124 extending through PMD 110. PMD 110 may be silicon dioxide and include dopants such as boron and phosphorus to form BPSG; the dopants help trap mobil ions. Indeed, PMD 110 may be a layered structure with undoped silicon dioxide in contact with the gates and with BPSG over the undoped oxide. The metal lines may be made of aluminum with TiN cladding on top and bottom. Metal lines 112–120 are 0.25–0.5 μm wide and 0.7 μm high with only 0.25–0.5 μm spacing between lines 112–116 and between lines 118–120. Thus the dielectric constant of the insulator between the metal lines should be as small as possible to limit capacitive coupling.

Figure 1A:
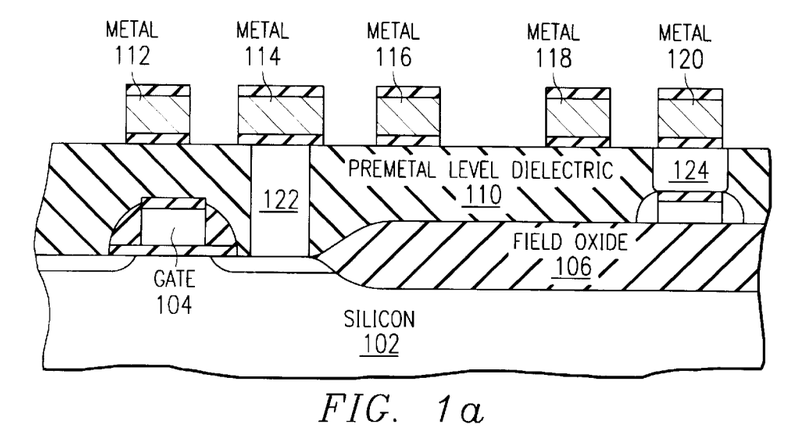
FIGS. 1a–f illustrate in cross sectional elevation views the steps of a first preferred embodiment and method.
Figure 1B:
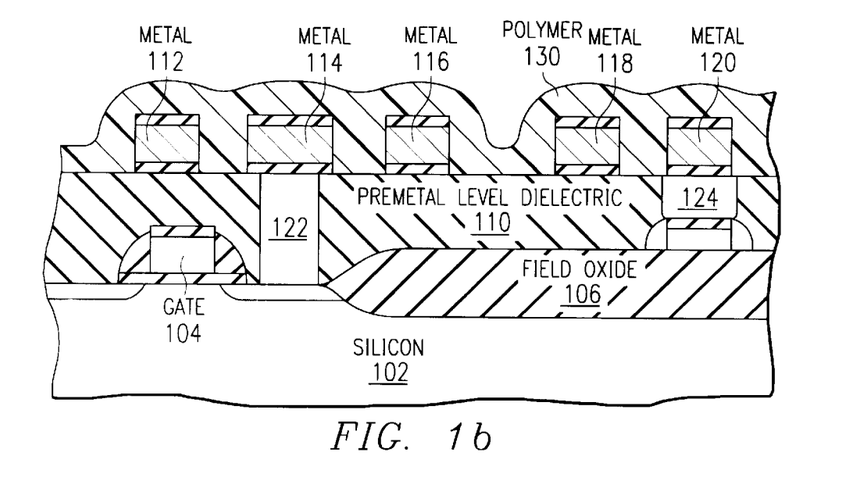
Figure 2:
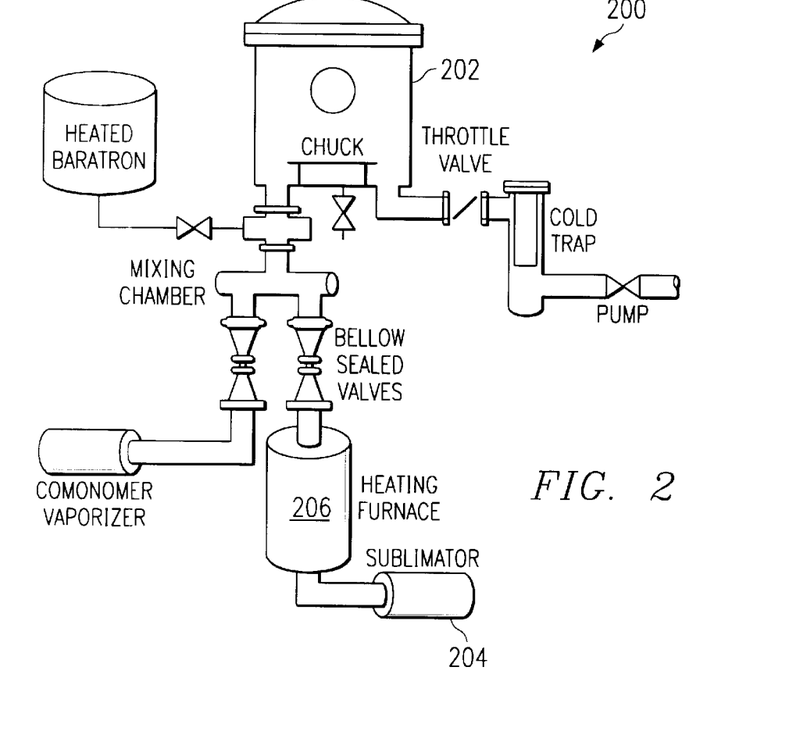
FIG. 2 shows a deposition apparatus.

Conformally deposit a 0.25 μm thick layer 130 of a copolymer of parylene and 2,4,6,8-tetravinyl-2,4,6,8-tetramethyl-cyclotetrasiloxane (TVTMCTS) on PMD 110 and metal lines 112–120 as shown in FIG. 1b. The deposition occurs in low pressure (about 13 mTorr) deposition system 200 illustrated in FIG. 2. System 200 includes deposition chamber 202 with two valved inlets: one for TVTMCTS vapors and one for parylene monomers which derived from dimers sublimated in chamber 204 and then cracked into monomers in furnace 206. TVTMCTS is a liquid at room temperature and has a vapor pressure of of about 13 mTorr at 60° C., whereas parylene dimer is a solid at room temperature and may be sublimed at 120° C. with a vapor pressure of about 13 mTorr. Maintain the connecting piping and deposition chamber 202 at temperatures above 120° C. to preclude condensation or polymerization on their surfaces. Substrate 102 is chilled to about −5° C. for copolymerization. The monomers randomly copolymerize and do not form a block copolymer. A representative reaction is:

The heated cracker may have a temperature about 660° C. Substrate 102 is the only surface exposed to the comonomers with a low enough temperature for condensation or polymerization. Note that a parylene monomer can bond with either another parylene monomer or a TVTMCTS monomer, and similarly, a TVTMCTS monomer can bond with either another TVTMCTS monomer or a parylene monomer. Thus the copolymer may be chains of monomers with various length stretches of parylene monomers and TVTMCTS monomers. Further, the multiple vinyl groups on each TVTMCTS monomer permits crosslinking of chains of monomers through two or more vinyl groups in a single TVTMCTS monomer binding as follows:

Crosslinking will increase mechanical strength.

The ratio of parylene monomer to TVTMCTS monomer in the resulting copolymer can be controlled by the rates of flow of the monomers into chamber 202. An average composition of 50% parylene monomers and 50% TVTMCTS monomers yields a copolymer with a dielectric constant of about 2.1, good adhesion to silicon dioxide (perhaps due to siloxane ring opening and bonding directly to the oxide), and good mechanical strength.

Figure 1C:
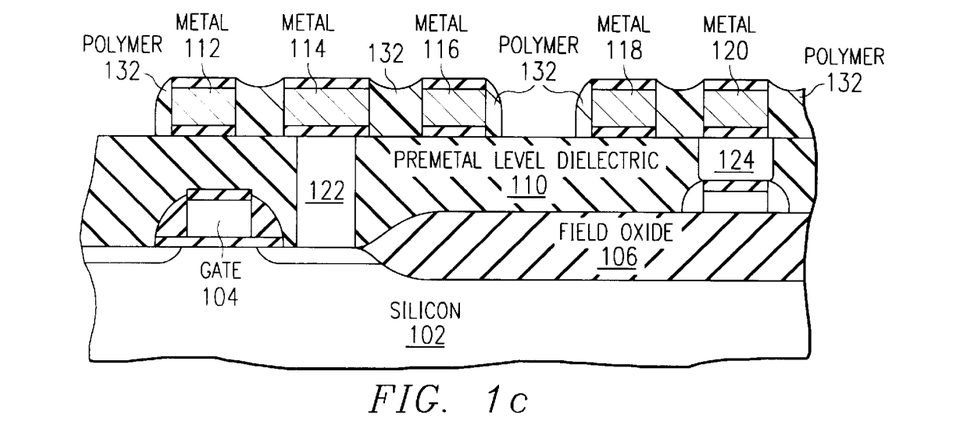

After the deposition of copolymer 130, anisotropically etchback copolymer 130 with a fluorine-oxygen-based plasma so that copolymer only remains in the spaces between adjacent metal lines plus possibly on the exterior sidewalls; see FIG. 1c showing etched back copolymer portions 132.

Figure 1D:
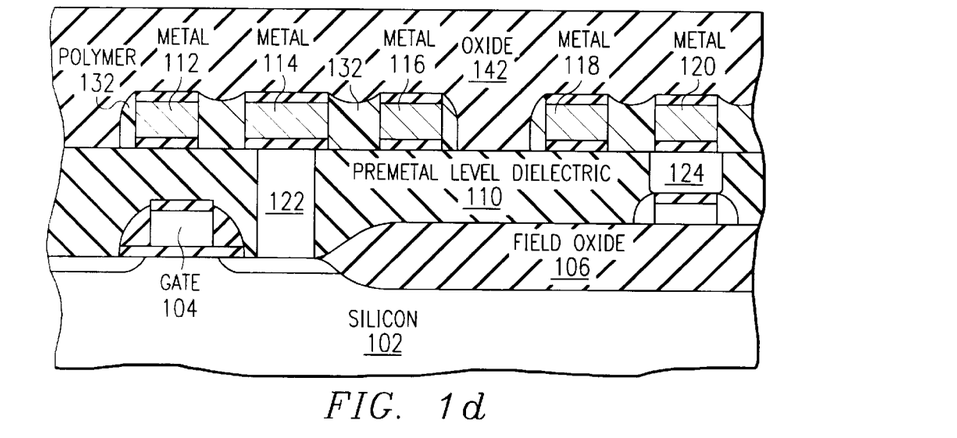

Then deposit a (fluorinated) oxide layer to a thickness of about 1 μm on the etched back copolymer 132 and exposed metal lines plus exposed underlying PMD. Lastly, use CMP to planarize the deposited (fluorinated) oxide to leave planar (fluorinated) oxide 142 as shown in FIG. 1d. Vias may be formed in oxide 142 and another layer of metal wiring formed on oxide 142 with connections down to metal wiring 112–120 through the vias. The oxide deposition may be done by plasma-enhanced TEOS (plus fluorine source) deposition and completes the first intermetal level dielectric (IMD) which consists of copolymer 132 plus (fluorinated) oxide 142. The low dielectric constant copolymer material 132 fills the minimal spacings between the metal lines.

Figure 1E:
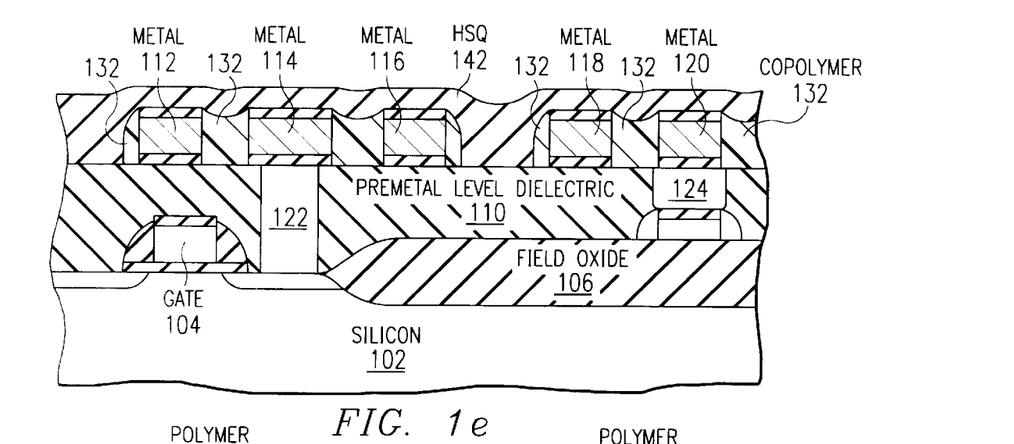
Figure 1F:
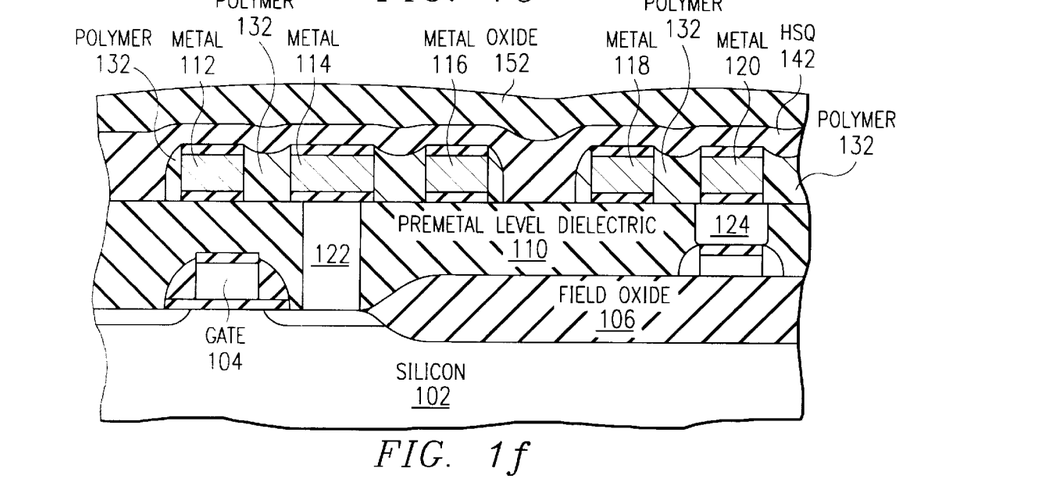

FIGS. 1e–f illustrate an alternative IMD structure which replaces planarized oxide 142 with spun-on glass 142 for planarization and deposited capping oxide 152. In particular, after the etchback of copolymer 132 (see FIG. 1c), spin on hydrogen silsesquioxane (HSQ) to an average thickness of about 0.5 μm; the thickness of HSQ layer 142 will be only about 0.2 μm over the metal lines. Cure the HSQ. See FIG. 1e.

Then deposit oxide layer 152 to a thickness of about 0.2 μm on HSQ layer 142; see FIG. 1f. The oxide deposition again may be by plasma-enhanced TEOS deposition and completes the intermetal level dielectric which consists of parylene-TVTMCTS copolymer 132 between the metal lines, planarizing HSQ 142, plus oxide 152.

Copolymer 132 provides a low dielectric constant of roughly 2.1 despite the presence of silicon-oxygen bonds which may be expected to be fairly polarizable in view of the dielectric constant of silicon dioxide. However, the siloxane ring in copolymer 132 may in effect provide microvoids and thus lower the dielectric constant.

Copolymer 132 also provides good adhesion to silicon dioxide and nitride plus metals (possibly due to the silicon and oxygen content), high thermal stability, conformal deposition filling narrow crevices, ease of patterning and etching, low film stress, low water absorption, high electrical resistivity, high breakdown electric field, and low leakage currents with deposition at temperatures low enough to not cause hillocks in the aluminum-based metallization schemes.

Precursor Preparation

The parylene-N dimer and TVTMCTS are both commercially available products with prices of roughly $1.00 and $0.50 per gram, respectively.

Variations of Imbedded Polymer Preferred Embodiments

Variations of the first preferred embodiment imbedded copolymers include substitution of fluorines for some of the hydrogens in carbon-hydrogen bonds. In particular, aliphatic fluorinated and/or aromatic fluorinated parylene monomers (dimers), as noted in the background, could be used. Similarly, fluorinated versions of TVTMCTS could be used. A fluorinated copolymer should have a lower dielectric constant and better thermal stability.

Figure 3:
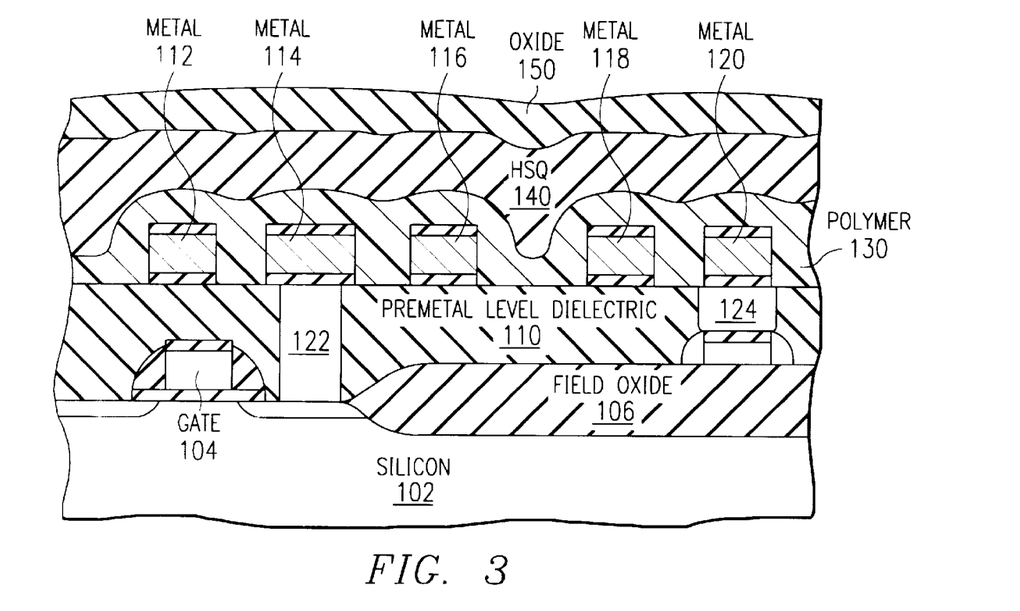
FIG. 3 illustrates a second preferred embodiment and method.

Similarly, the TVTMCTS monomer could be replaced with related monomers, or mixtures of related monomers, such as a three or five siloxane ring, ethyl groups rather than methyl groups, allyl groups rather than vinyl groups, and so forth. For example, Imbedded Polymer Preferred Embodiment FIG. 3 illustrate a second preferred embodiment IMD structure and method of fabrication. In particular, begin as with the first preferred embodiment and deposit parylene-TVTMCTS copolymer 130 over metal lines as shown in FIGS. 1a–b; but do not anisotropically etchback.

Next, spin on layer 140 of planarizing glass such as hydrogen silsesquioxane (HSQ) to an average thickness of about 0.5 μm; the thickness of HSQ layer 140 will be only about 0.2 μm over the metal lines. Cure the HSQ. This planarizes the surface.

Then deposit oxide layer 150 to a thickness of about 0.2 μm on HSQ layer 140; see FIG. 3. Oxide 150, which may be fluorinated, provides a capping layer on HSQ 140. The oxide deposition again may be by plasma-enhanced TEOS deposition and completes the intermetal level dielectric which consists of parylene-TVTMCTS copolymer 130 surrounding the metal lines, planarizing HSQ 140, plus capping oxide 150.

Alternative spin on glasses could be used and a partial etchback may be included to thin any of the layers. In particular, the spin on glass could be totally removed on copolymer 130 over the metal lines and only remain in the crevices and low areas between sets of metal lines.

Multiple Metal Layers Preferred Embodiment

Figure 4A:
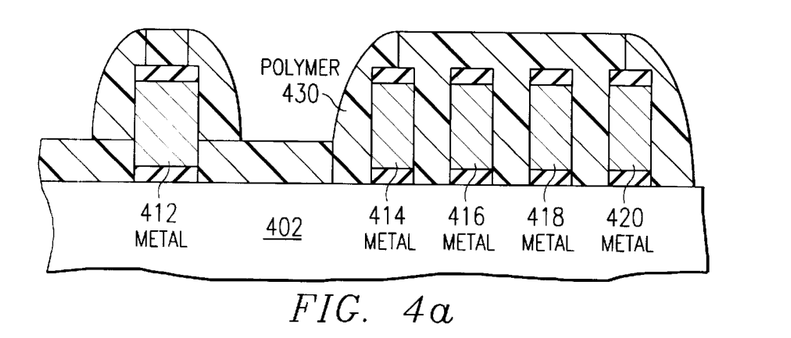
FIGS. 4a–c show successive applications of the second preferred embodiment.
Figure 4B:
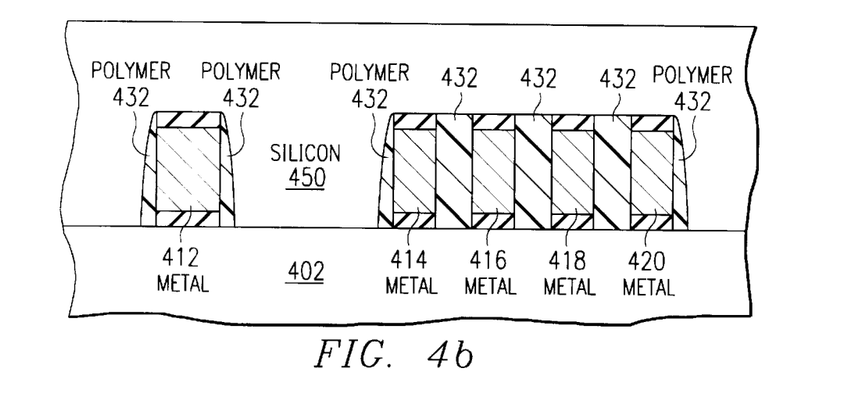
Figure 4C:
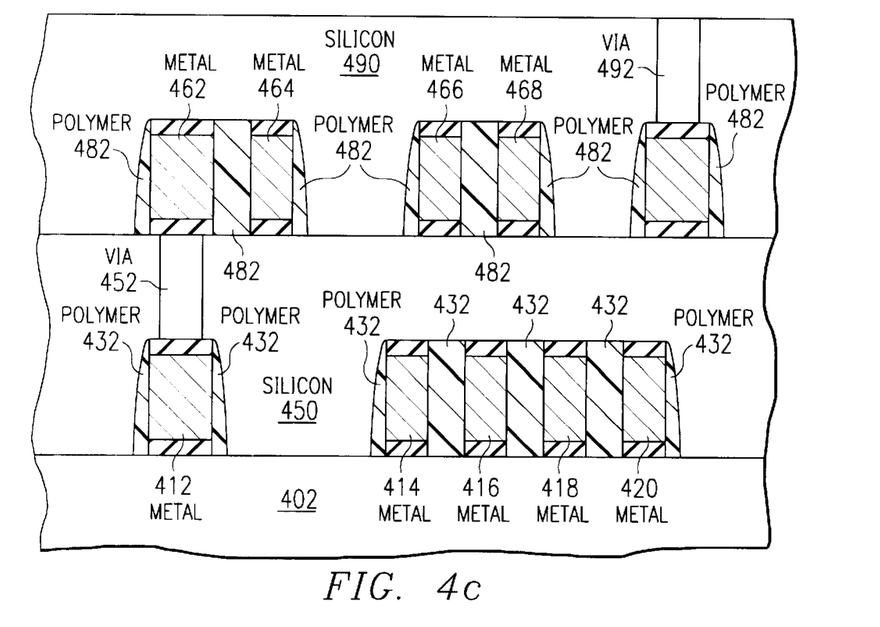

FIGS. 4*a–c* show two successive applications of the first preferred embodiment type of IMD for two successive metal levels. In particular, FIG. 4*a* shows parylene-TVTMCTS 430 conformally deposited over metal lines 412–420 on insulator 402. Metal lines 414–420 are about 0.25 μm wide and 0.7 μm high with 0.25 μm spacings, metal line 412 is about 0.4 μm wide and represents a widening of a metal line for vertical via connection. Again, the metal could be aluminum with cladding such as TiN on both the top and bottom.

FIG. 4*b* shows polymer 432 etched back to fill between the closely spaced metal lines and form sidewalls on the others. FIG. 4*b* also shows planarized oxide 450 covering the metal lines and polymer to a thickness of about 0.7 μm. Oxide 450 could be plasma-enhanced deposited with simultaneous sputtering for planarization, or could use a sacrificial layer etchback for planarization.

FIG. 4*c* shows metal-filled via 452 connecting first level metal line 412 through oxide 450 up to second level metal line 462 together with other second level metal lines 464–470 on oxide 450. Etched back polymer 482 fills in between closely spaced metal lines 462–470 and forms sidewalls spacers on others, and planarized oxide 490 covers the second level metal lines. Metal-filled via 492 connects second level metal line 470 to third level metal lines (not shown) later formed on oxide 490. Metal-filled vias 452 and 492 may be formed by first photolithographic patterning and etch the oxide followed by filling with tungsten through either blanket deposition plus etchback or selective deposition. The metal lines are formed by blanket metal deposition followed by photolithographic patterning and anisotropic etching.

Polymer Refill Preferred Embodiment

Figure 5A:
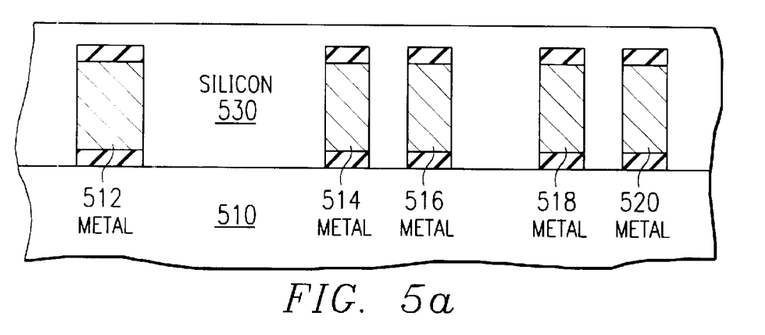
FIGS. 5a–d illustrate successive applications of the third preferred embodiment.

FIGS. 5*a–d* illustrate in cross sectional elevation views two successive applications of a third preferred embodiment type of IMD for two successive metal levels. Indeed, FIG. 5*a* shows metal lines 512–520 on insulating layer 510 and with planarized oxide layer 530 overlying the metal lines. Metal lines 514, 516, 518, and 520 have a minimal linewidth, about 0.25 μm wide, and a height of about 0.7 μm; whereas, metal line 512 indicates a width increase to about 0.4 μm for via alignment ease. The spacings between the metal lines in metal line pairs 514–516 and 518–520 are minimal, about 0.25 μm, but other spacings are larger. The metal lines are formed by blanket deposition followed by photolithographic patterning; the metal could be cladded aluminum.

Figure 5B:
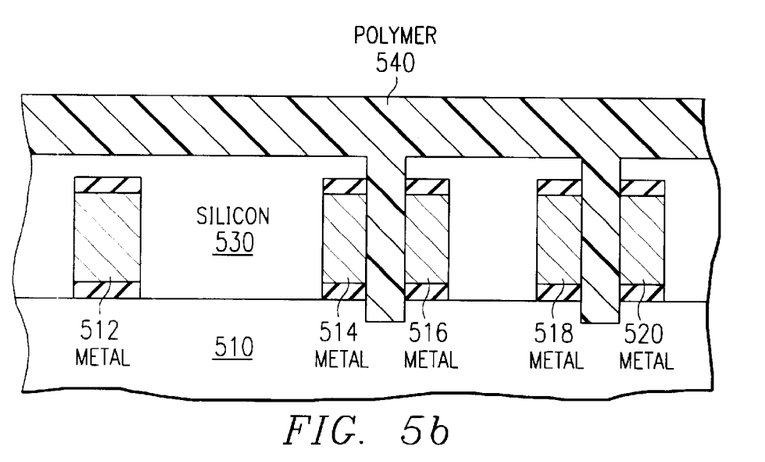

Photolithographically locate the minimal metal line spacings and etch oxide 530 out from the minimal spacings. The etch may be an anisotropic plasma etch or could be selective with respect to the metal and use the metal lines as lateral etchstops. An overetch into the underlying insulator 510 may be used. After the oxide etch, conformally deposit parylene-TVTMCTS copolymer 540 as previously described; the conformal deposition to a thickness of at least 0.125 μm will fill the minimal spacings; see FIG. 5*b* illustrating a deposition of about 0.4 μm of polymer.

Figure 5C:
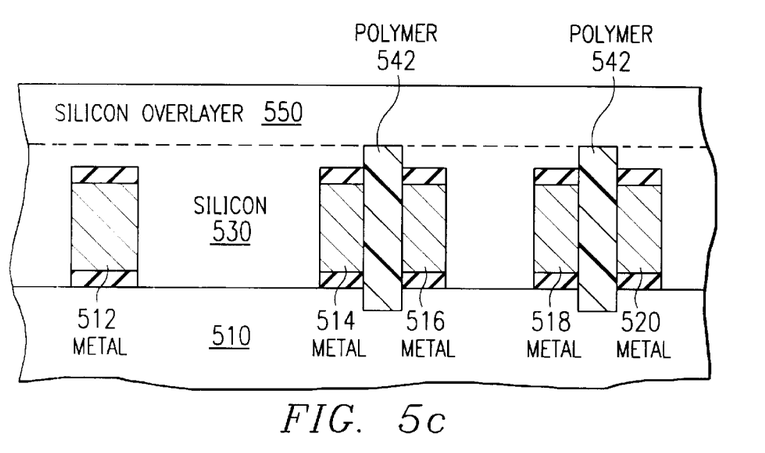
Figure 5D:
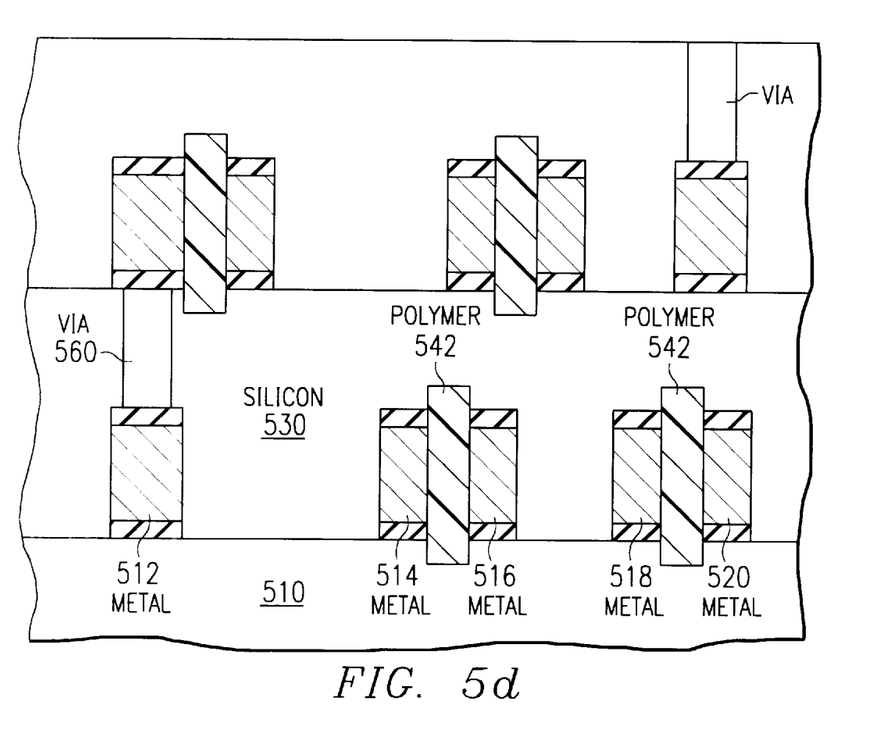

FIG. 5*c* shows an etchback of polymer 540 to leave only polymer fillers 542 in the minimal spacings. After the polymer etchback, deposit about 0.5 μm of oxide 550.

The metal level is completed by photolithographically defining and etching vias in oxides 530–550 to the wide portions of the metal lines such as metal line 512; then fill the vias by either selective metal deposition or blanket deposition and etchback. The vias may be filled with tungsten with a barrier layer. The metal-filled vias 560 provide connection to a second metal level which is formed in the same manner as the metal level just described; see FIG. 5*d*. An alternative would be to deposit the metal which fill vias 560 and is patterned to form the second level metal lines in as a single step. This could be any conformal metal deposition method such as chemical vapor deposition or a reflow of metal such as aluminum; optionally a sputtered barrier metal layer could be initially deposited.

Silane Preferred Embodiments

The cyclic siloxane in the copolymerization of parylene monomers and TVTMCTS monomers could be replaced with a silane derivatives in order to eliminate the polarizable silicon-oxygen bonds to decrease dielectric constant but still maintain silicon for adhesion bonding to silicon oxides or nitrides. In particular, divinyldimethylsilane contains vinyl groups for copolymerization with parylene monomers plus the presence of two vinyls per monomer permits crosslinking for mechanically strong copolymers. A reaction could be Of course, the silane could have three or four vinyl groups to enhance crosslinking.

Silylcyclo Preferred Embodiments

Unsaturated silylcyclo compounds could also provide comonomers for copolymerized with parylene; a double bond in the comonomer ring would participate in the copolymerization. In particular, cyclopentadiene derivatives such as trimethylsilylcyclopentadiene (including a final saturated ring form), bis(trimethylsilyl)cyclopentadiene (including a final saturated ring), and tris(trimethylsilyl)cyclopentadiene (including a final saturated ring). These copolymers would have structures such as:

Of course, variations such as six-member rings, ethyl groups in place of methyl groups on the silicon, double bonds in the ring, fluorine substitutions for hydrogen, and so forth will yield analogous copolymers.

Applications

The foregoing copolymers between metal (or other conductive) lines can be applied to various integrated circuit types. For example, DRAMs have many sets of long parallel conductive lines such as bitlines, wordline straps, address and data busses, and so forth, and the copolymers insure adhesion plus gap filling within such sets of parallel lines to cut down capacitive coupling. The copolymer may be located directly over transistors (e.g., between metal lines 112–114 in FIG. 1c) or offset over transistors (e.g., between metal lines 118–120 in FIG. 1c) or over or under other metal lines.

Modifications

Modifications of the preferred embodiment copolymers can be made while retaining their features of copolymerization of parylene with compound(s) containing both silicon-carbon and unsaturated carbon-carbon bonds. For example, parylene plus two other comonomers could be used. More specifically, the siloxane rings could be from two siloxanes to six or more, although large rings may lose any microvoid characteristics; the size of the functional groups on the siloxane rings could be varied and possibly the silicons could have differing pairs of groups (such as 2,4,-divinyl-2,8,8-trimethyl-4,6-diethyl-6-allyl-cyclotetrasiloxane,). Similarly, the silylcyclo comonomers could be varied. Further, simple fluorinated groups, such as $CF_3$, $C_2F_5$, $C_3F_7$, . . . , could be substituted on the rings. Indeed, copolymers of comonomers with differing fluorine content could be used.

What is claimed is:

1. An insulation material, comprising:
   a copolymer of (fluorinated) parylene and a comonomer selected from the group consisting of (fluorinated) silicon-carbon compounds containing at least one unsaturated carbon-carbon bond.

2. An integrated circuit, comprising:
   (a) devices at a surface of a substrate; and
   (b) an insulation layer over said devices, said layer including a copolymer of (fluorinated) parylene and a comonomer selected from the group consisting of (fluorinated) silicon-carbon compounds containing at least one unsaturated carbon-carbon bond.

3. The integrated circuit of claim 2, wherein:
   (a) said (fluorinated) silicon-carbon compound comonomer includes silicon-oxygen bonds.

4. The integrated circuit of claim 3, wherein:
   (a) said (fluorinated) silicon-carbon compound comonomer is a tetravinylcyclotetrasiloxane.

* * * * *